United States Patent
Sheridan et al.

(10) Patent No.: US 11,245,016 B2
(45) Date of Patent: Feb. 8, 2022

(54) SILICON CARBIDE TRENCH SEMICONDUCTOR DEVICE

(71) Applicant: Alpha and Omega Semiconductor (Cayman) Ltd., Grand Cayman (KY)

(72) Inventors: David Sheridan, Greensboro, NC (US); Vipindas Pala, San Jose, CA (US); Madhur Bobde, Sunnyvale, CA (US)

(73) Assignee: ALPHA AND OMEGA SEMICONDUCTOR (CAYMAN) LTD., Grand Cayman (KY)

( * ) Notice: Subject to any disclaimer, the term of this patent is extended or adjusted under 35 U.S.C. 154(b) by 108 days.

(21) Appl. No.: 16/779,374

(22) Filed: Jan. 31, 2020

(65) Prior Publication Data
US 2021/0242319 A1 Aug. 5, 2021

(51) Int. Cl.
| | | |
|---|---|---|
| *H01L 21/04* | (2006.01) | |
| *H01L 29/06* | (2006.01) | |
| *H01L 29/66* | (2006.01) | |
| *H01L 29/78* | (2006.01) | |
| *H01L 29/423* | (2006.01) | |
| *H01L 29/16* | (2006.01) | |
| *H01L 29/10* | (2006.01) | |
| *H01L 29/08* | (2006.01) | |

(Continued)

(52) U.S. Cl.
CPC ........ *H01L 29/4236* (2013.01); *H01L 21/049* (2013.01); *H01L 21/0465* (2013.01); *H01L 21/0475* (2013.01); *H01L 29/045* (2013.01); *H01L 29/0865* (2013.01); *H01L 29/1095* (2013.01); *H01L 29/1608* (2013.01); *H01L 29/36* (2013.01); *H01L 29/66068* (2013.01); *H01L 29/7803* (2013.01); *H01L 29/7813* (2013.01)

(58) Field of Classification Search
CPC . H01L 21/04; H01L 21/0465; H01L 21/0475; H01L 21/049; H01L 29/06; H01L 29/0696; H01L 29/08; H01L 29/0865; H01L 29/16; H01L 29/1608; H01L 29/045; H01L 29/36; H01L 29/42; H01L 29/4236; H01L 29/1095; H01L 29/66; H01L 29/66068; H01L 29/78; H01L 29/7802; H01L 29/7803; H01L 29/7813
USPC .......................................................... 257/77
See application file for complete search history.

(56) References Cited

U.S. PATENT DOCUMENTS

| | | |
|---|---|---|
| 6,091,107 A | 7/2000 | Amaratunga et al. |
| 6,768,168 B1 | 7/2004 | Takahashi |

(Continued)

*Primary Examiner* — Fazli Erdem
(74) *Attorney, Agent, or Firm* — JDI Patent; Joshua Isenberg; Robert Pullman

(57) ABSTRACT

A semiconductor apparatus has a silicon carbide substrate heavily doped with the first conductivity type and a lightly doped silicon carbide drift region of the first conductivity type over the silicon carbide substrate. A first body region in the drift region is doped with second conductivity type opposite the first. A first source region in the first body region is heavily doped with the first conductivity type. A gate trench is formed in the first source region and first body region. At least one sidewall of the gate trench is parallel to a crystal plane of the silicon carbide structure having greater carrier mobility than a C-face thereof. The gate trench extends a length of the first body region and the source region to a separation region laterally adjacent to the first region wherein the separation region is in the drift region.

19 Claims, 19 Drawing Sheets

(51) Int. Cl.
*H01L 29/04* (2006.01)
*H01L 29/36* (2006.01)

(56) References Cited

U.S. PATENT DOCUMENTS

| | | |
|---|---|---|
| 8,138,504 B2 | 3/2012 | Harada et al. |
| 9,048,282 B2 | 6/2015 | Hu et al. |
| 2005/0280029 A1 | 12/2005 | Nakamura et al. |
| 2007/0114570 A1 | 5/2007 | Yamaguchi et al. |
| 2009/0039386 A1 | 2/2009 | Ogura et al. |
| 2009/0309156 A1 | 12/2009 | Darwish et al. |
| 2011/0017998 A1* | 1/2011 | Nakano ............ H01L 29/66068 257/66 |
| 2013/0341643 A1* | 12/2013 | Kudou ............... H01L 29/0634 257/77 |
| 2014/0008664 A1 | 1/2014 | Kudou |
| 2017/0117352 A1* | 4/2017 | Esteve ................. H01L 29/063 |
| 2017/0125560 A1* | 5/2017 | Voss .................... H01L 29/0646 |
| 2019/0097042 A1* | 3/2019 | Meiser ............... H01L 29/0865 |
| 2019/0371889 A1* | 12/2019 | Narita ................. H01L 29/401 |

\* cited by examiner

SILICON CARBIDE TRENCH SEMICONDUCTOR DEVICE

FIELD OF THE INVENTION

Aspects of the present disclosure generally relate to silicon carbide semiconductor device and more particularly to silicon carbide trench metal-oxide field effect transistors (MOSFET).

BACKGROUND OF THE INVENTION

Silicon Carbide (SiC) transistors, particularly MOSFETs, have reached significant advances with planar structures. Unfortunately, for SiC MOS technology, the mobility in the channel is significantly lower on the C-face where planar MOSFETs are traditionally fabricated. The low mobility on traditional planar MOFET devices increases the specific on-resistance (Ron,sp) of the device which results in a larger die size for a given device resistance rating. In order to reduce the SiC MOSFET die size, the mobility must be increased in the channel to take full advantage of the SiC benefits.

One alternative to create a SiC MOS channel with higher mobility is to create a MOSFET with a channel on the $11\bar{2}0$ face of the hexagonal SiC crystal structure. Unfortunately, SiC crystals are not grown such that one can slice a boule with this plane on the surface to create a planar MOSFET. It is therefore necessary to create a trench-type MOSFET where a trench is etched into the SiC surface and the channel is created along the trench sidewall corresponding to the $11\bar{2}0$ face.

Similar to Si trench devices, the SiC trench device allows a vertical channel along the sidewall of the gate through a p-region where inversion happens. Unlike plain Silicon devices, the field in SiC can have 10× lower resistance due to the higher critical field in SiC that requires additional shielding of the gate oxide and trench area. This is done with adjoining p+ regions under the trench JFET region—but the downside is additional pinch resistance and loss of active area from reduced trench density.

It is within this context that aspects of the present disclosure arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following discussion, the first conductivity type is typically N and the second conductivity type is P. However, it should be noted that substantially similar devices may be fabricated using a similar process but with conductivity types opposite those shown and described. Specifically, aspects of the present disclosure include implementations like those shown and described herein in which N is substituted for P and vice versa.

According to embodiments of the present invention, the active trench sidewall current flow is lateral along a crystal plane of the silicon carbide (SiC) structure having higher carrier mobility than a C-face of the SiC structure (e.g., the 11$\bar{2}$0 plane) with a channel width defined by implantation depth (variable). The advantage of this structure is keeping the channel region enclosed by the p+ well with significantly lower electric field stress. A Channel definition maybe created with a full self-aligned process similar to planar devices—eliminating the need for deep and critically aligned p+ implants. Additionally, the trench does not need to be critically aligned to the well structures and can be formed after all implants/activations allowing for a more robust trench process.

Figure 1A:
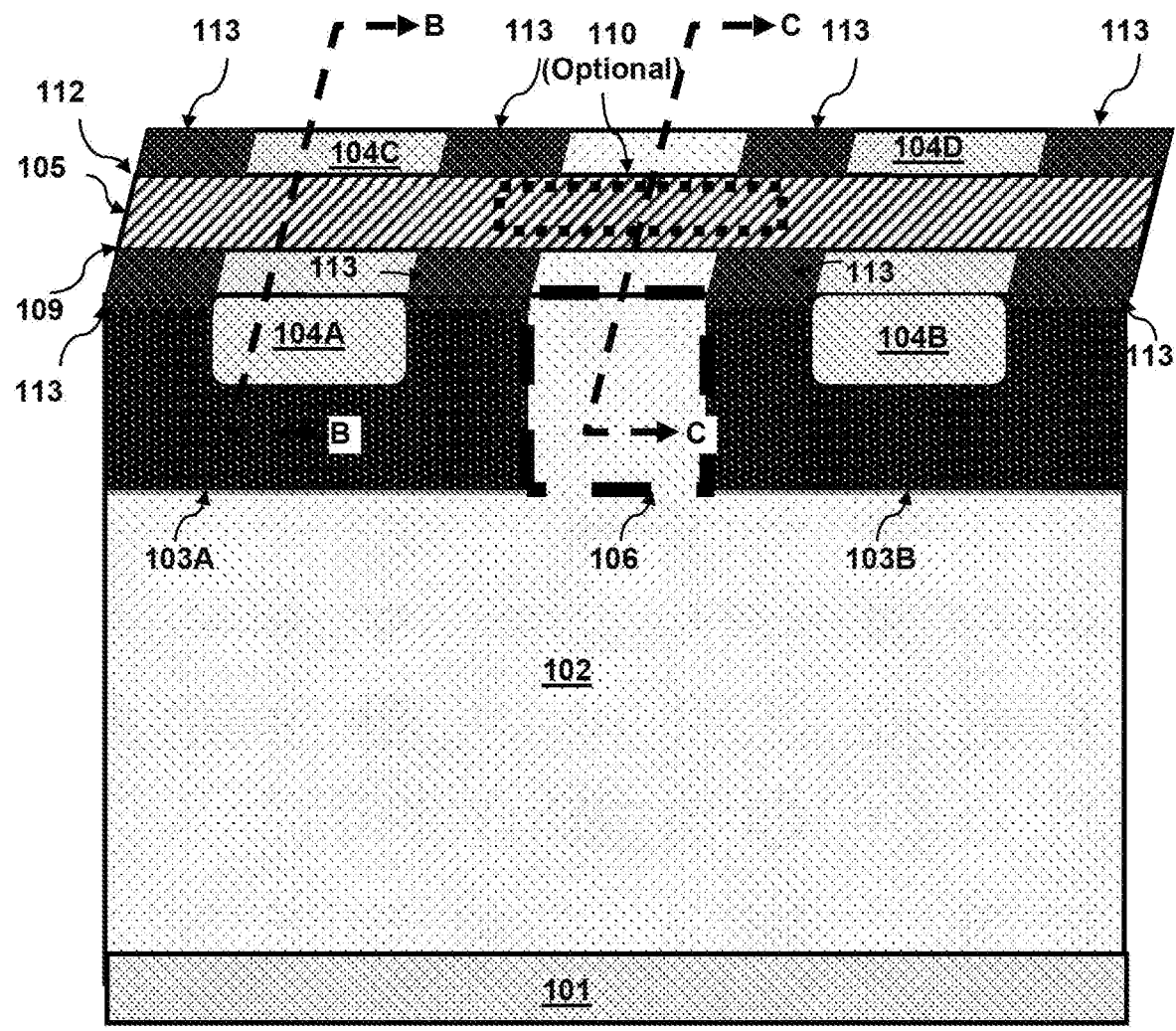
FIG. 1A depicts a three quarter view of a silicon carbide (SiC) trench semiconductor device according to aspects of the present disclosure.

FIG. 1A depicts a silicon carbide trench semiconductor device according to aspects of the present disclosure. The SiC device may be constructed on a SiC substrate 101 doped with the first conductivity type. According to some embodiments of the present disclosure, the SiC substrate may be comprised of the 4H-Silicon Carbide polytype. Overtop the SiC substrate 101 a drift region 102 of silicon carbide may be formed using epitaxy. The drift region 102 may be more lightly doped with the first conductivity type than the substrate 101. The drift region doping concentration may range for example and without limitation between $1e^{15}$ to $1e^{17}/cm^3$.

Body regions 103A, 103B may be formed in the drift region 102. The Body regions 103A, 103B may be heavily doped with the second conductivity type. In some implementations, the body regions 103A, 103B may be doped with a gradient where the doping concentration increases with depth so that the maximum concentration occurs at a maximum depth of the body region. According to some aspects of the present disclosure the doping concentration of the body, regions 103A and 103B may be for example and without limitation $1e^{16}$ to $1e^{20}/cm^3$. Additionally the body region may be formed with an energy for example and without limitation between 30 KeV and 1.2 MeV.

Source regions 104A, 104B, 104C, 104D may be formed in the body regions 103A, 103B. In the embodiment shown source regions 104A and 104C and similarly 104B and 104D may be formed initially as part of a contiguous region and then separated after the formation of the trench 105. The Source regions 104A, 104B, 104C, 104D may be doped with the first conductivity type at a higher concentration than the drift region. The source regions 104A, 104B, 104C, 104D may have a doping concentration for example and without limitation of $1e^{18}$ to $2e^{20}/cm^3$ and at an energy of, without limitation, 10 KeV to 600 KeV.

Surface body regions 113 may be formed on top of the body regions 103A, 103B around the source regions 104A, 104B, 104C, 104D. The surface body regions 113 may be more heavily doped than the body regions 103A, 103B. Similar to the source regions may be formed as a continuous region and the split by the gate trench 105. According to some aspects of the present disclosure, the doping concentration of the surface body regions 113 may be for example greater than $1e^{19}/cm^3$ and may be formed with an energy of, without limitation between 30 and 400 KeV.

As shown there may be a separation region 106 formed between a first body region 103A and a second body region 103B. The separation region may be laterally adjacent to the first 103A and second 103B body regions and formed in the drift region 102. In the embodiment shown in FIGS. 1A-1B and FIGS. 2A-2B the separation region is part of the drift region but in alternative embodiments like those shown in FIGS. 4G-4H and FIG. 5 the separation region is formed from a JFET region and has a greater doping concentration than the drift region as will be discussed in a later section. Alternatively, the JFET region can be masked as well.

During operation, the separation may also be referred to as the JFET region because the geometry of the gate trench 105 and the silicon crystal structure is chosen to allow greater carrier mobility laterally along the side of the gate trench 105 and then down through the separation region to the substrate and drain contract.

The gate trench 105 as discussed above is formed in the epitaxial layer in such a way that it causes once side of the trench to expose crystal plane 109 of the 4H-polytype structure having higher carrier mobility than the C-face. By way of example, and not by way of limitation, the exposed crystal plane 109 may be the 11$\bar{2}$0 face. The gate trench 105 runs through the first body region 103A, separation region 106 and second body region 103B. Gate trench 105 also runs through first source region 104A, 104C separating the source regions 104A and 104C and similarly the second source regions 104B and 104D.

Figure 1B:
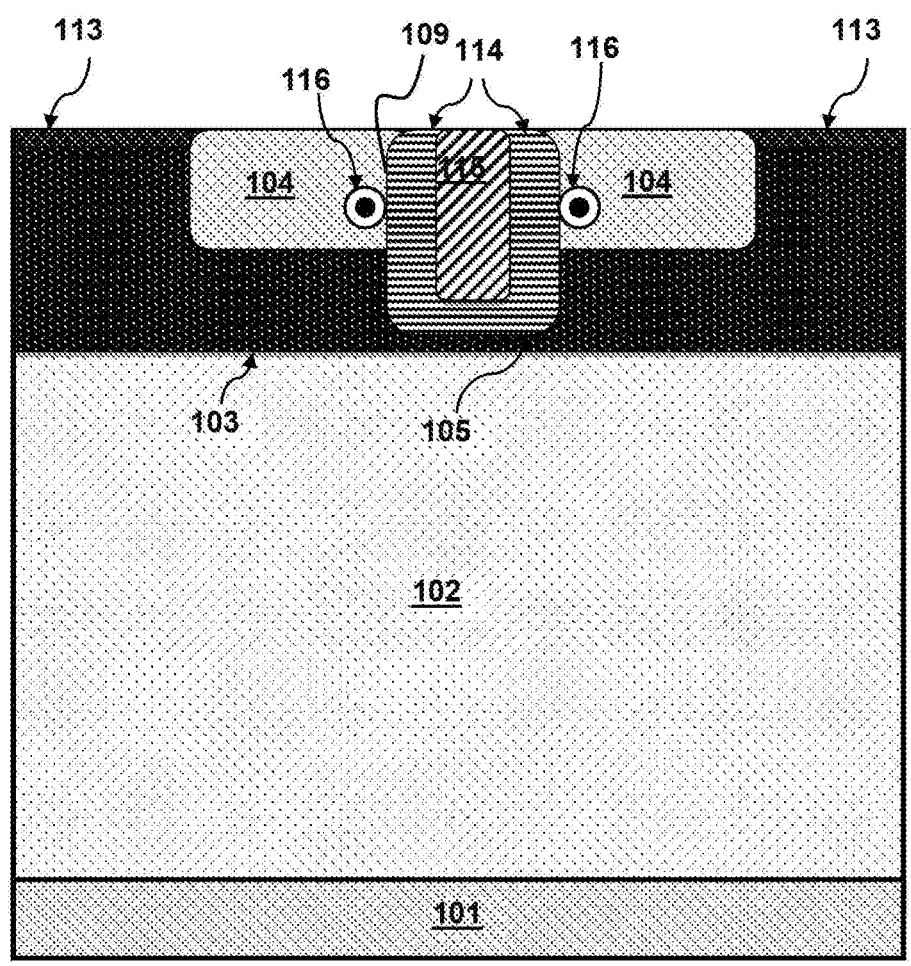
FIG. 1B depicts a cross-sectional view of a SiC trench semiconductor device according to aspects of the present disclosure along line B-B of FIG. 1A.
Figure 3A:
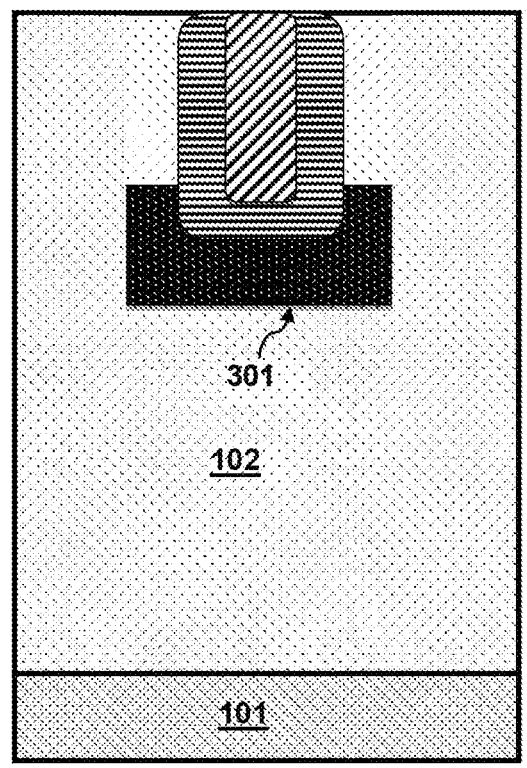
FIG. 3A shows a cross-sectional view of a possible alternative implementation of a SiC semiconductor device having a deep implant bridge region according to aspects of the present disclosure taken along line C-C of FIG. 1A.
Figure 3B:
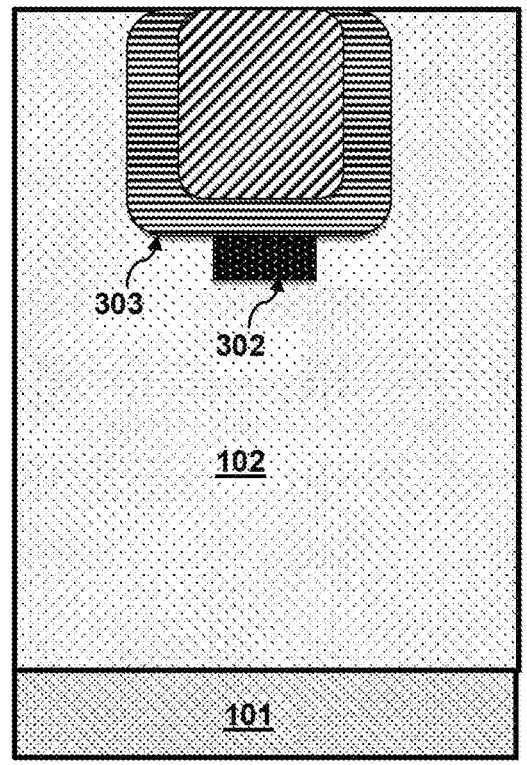
FIG. 3B depicts a cross-sectional view of a possible alternative implementation of a SiC semiconductor device having a body implant bridge region according to aspects of the present disclosure taken along line C-C of FIG. 1A.
Figure 3C:
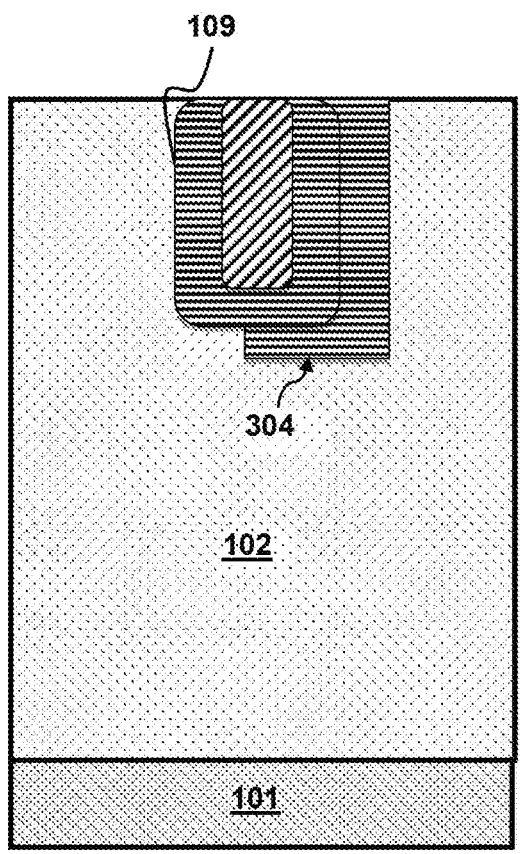
FIG. 3C shows a cross-sectional view of the SiC semiconductor device having a sidewall implant bridge region according to aspects of the present disclosure taken along line C-C of FIG. 1A.

The dashed line B-B shows the location of the cross section depicted in FIG. 1B and the dotted line C-C depicts the location the location of the cross section shown in FIGS. 3A-3C. The dotted box 110 shows the location of the optional bridge layer that will be discussed below with respect to FIGS. 3A-3C.

FIG. 1B depicts a cross-sectional view of the SiC semiconductor device. The gate trench 105 and carrier flow 116 are shown in greater detail. A gate trench dielectric 114 lines the inner portions of the sidewalls of the gate trench 105. A gate trench electrode 115 is formed on the inner portions of the dielectric 114. The gate dielectric 114 shields the gate trench electrode 115 from the current in other regions of the semiconductor device. The gate trench 105 is cut into the epitaxial layer at angle to parallel to the 11$\bar{2}$0 face 109. This geometry allows greater mobility of the charge carriers 116 parallel to the 11$\bar{2}$0 face thus reducing charge accumulation on the surface of the dielectric and thus increasing the shielding of the gate structures.

It should be understood that the while the description herein discloses first and second body regions and first and second source regions, aspects of the present disclosure are not so limited. There may be any number of body regions and source regions formed in the drift region. Additionally there may be any number of gate trenches and separation regions running laterally between body and source regions.

Figure 2A:
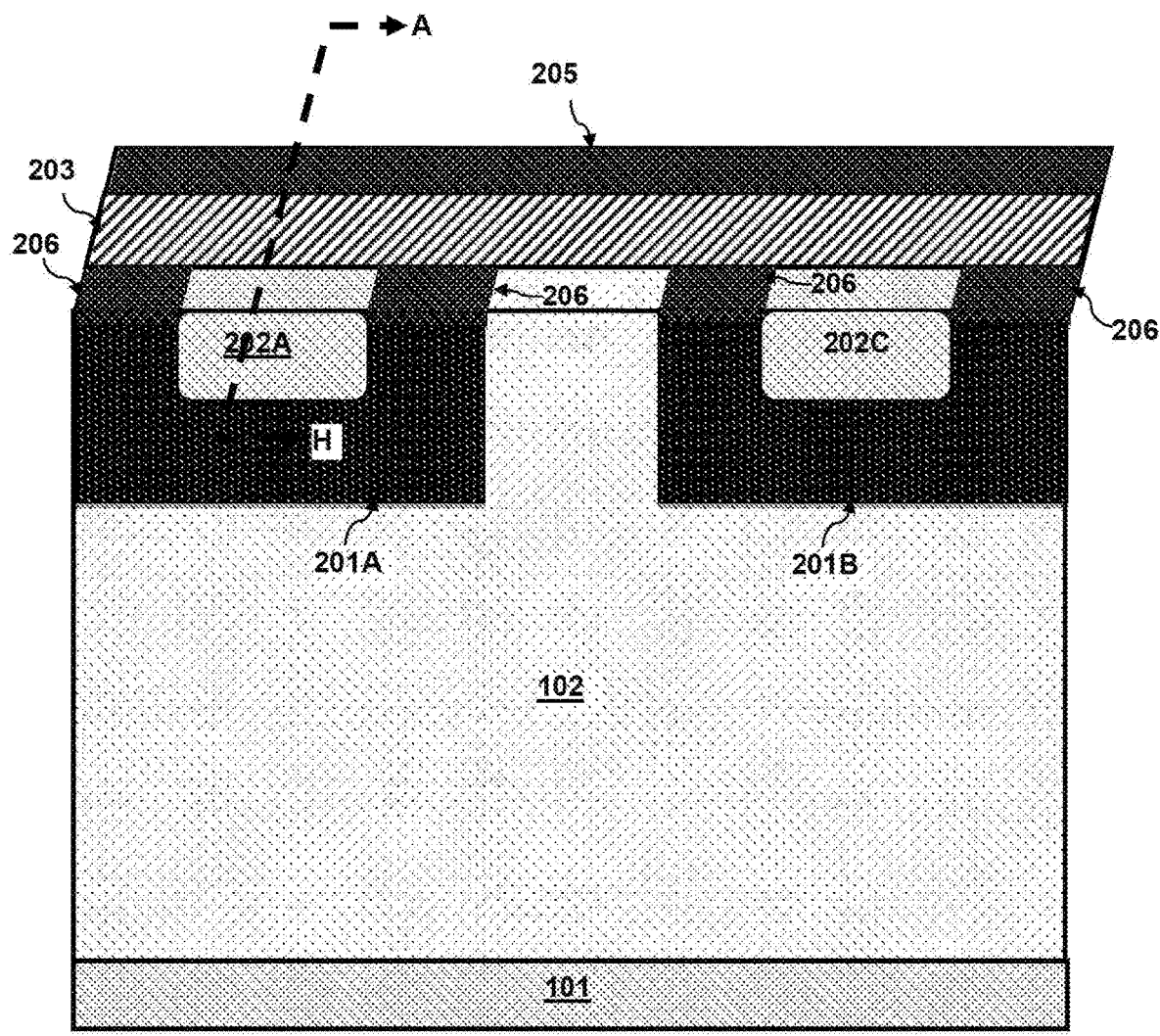
FIG. 2A shows a three quarters view of an alternative embodiment of the SiC semiconductor device having source and channel regions on only one side of the gate trench according to aspects of the present disclosure.

FIG. 2A shows a three quarter view of an alternative embodiment of the SiC semiconductor device according to aspects of the present disclosure. As shown, the drift region 102 has a first body region 201A of the second conductivity type with portions on both sides of the trench 203 and underneath the trench 203. The source region of the first conductivity type has been implanted only on one side of trench 202A preferably the side of the trench with the 11$\bar{2}$0 face. Alternatively, the source implant on the side of the trench opposite the 11$\bar{2}$0 face (sometimes called the second side) may be inactivated with a second conductivity type implant during another doping step. By way of example, and not by way of limitation, for an n-type source and p-type body, the source region on the second may be inactivated by reducing the conductivity of that region the conduction by implanting the region with a p-type body implant. Even if there were source implanted on the second side, there will be little to no conduction due to the very long "channel" resulting from the p-type body implant in this region.

Figure 2B:
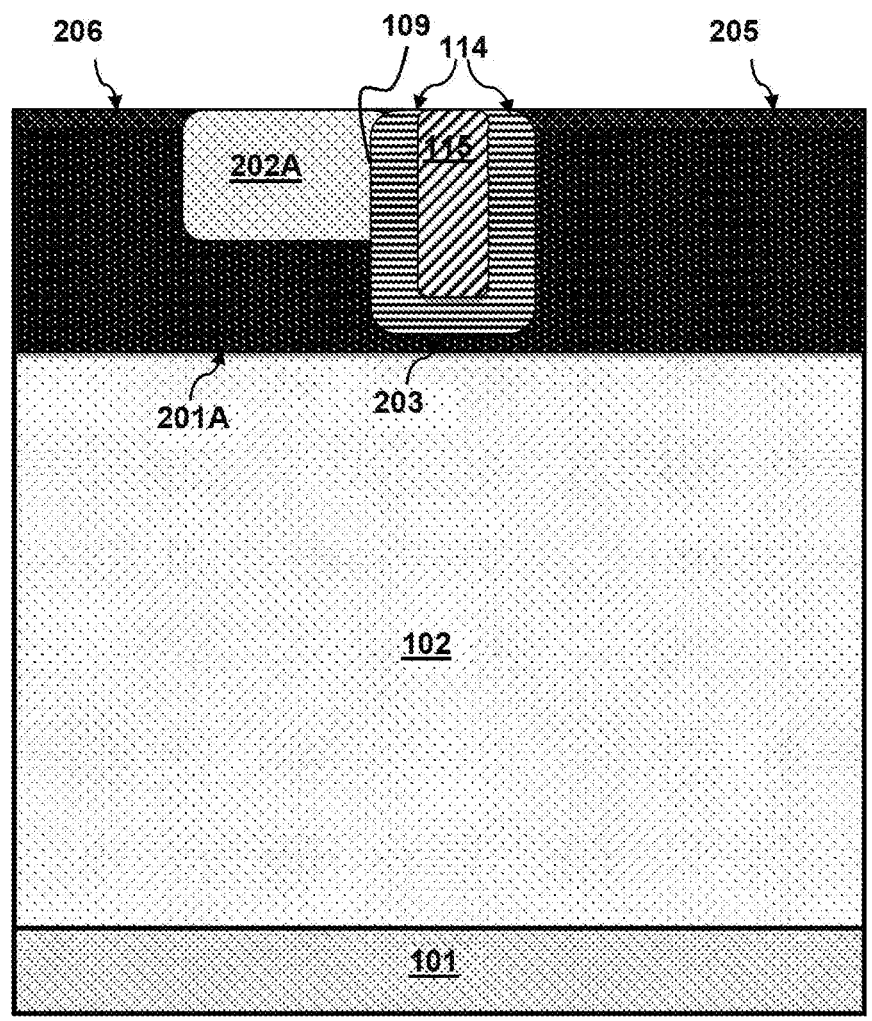
FIG. 2B shows a cross-sectional view of an alternative embodiment of the SiC semiconductor device having source and channel regions on only one side of the gate trench according to aspects of the present disclosure.

As shown in FIG. 2A, the first body region 201A and second body region 201B are separated by a separation region on one side of the trench 203 preferably the 11$\bar{2}$0 face. Similarly, the first source region 202A and second source region 202B are located in each respective body region and separated by the separation region. During operation, the separation region may act as a JFET as carriers travel laterally parallel to the 11$\bar{2}$0 face of the trench 203. As shown, the body regions 206A and 206B may be extended to run the length of the trench on the side of the trench opposite the 11$\bar{2}$0 face. As above a surface body region may be formed on top of the body region 206. The surface body region 205 may run the length of the trench 203 on the side opposite the 11$\bar{2}$0 face on top of the body region. The side of the trench 203 opposite the 11$\bar{2}$0 face may lack a separation region because the entire length of the sidewall of the trench is a body region of the second conductivity type with no source region or drift region lateral separation and no JFET region. FIG. 2B shows a cut away section of the semi-conductor device at the dotted line 204. The first body region 201A has portions that extend under the trench 203 and around both side of the trench 203. The first source region 202A of the first conductivity is located in the body region 201A preferably on the 11$\bar{2}$0 side 109 of the trench. As shown, a heavily doped surface body region 206 of the second conductivity type may be located on the surface of the body region 201A with no source region on the side of the trench opposite the 11$\bar{2}$0 face 109.

FIGS. 3A-3C depicts various different embodiment of the bridge according to aspects of the present disclosure. As discussed above with respect to FIG. 1A a bridge region 110 may be located underneath the trench in the separation region 106. The bridge region may be doped with the second conductivity type and extend under the trench 105 from the first body region 103A to the second body region 103B. The bridge 110 may have the same doping concentration as the body regions.

FIG. 3A shows cross-sectional view along dotted line 111 of the SiC semiconductor device having a deep implant bridge region 301 according to aspects of the present disclosure. By way of example, if the first conductivity type is n-type and the second conductivity type is p-type, the deep implant bridge region 301 may be formed by performing a doping implant of the second conductivity type at a desired depth and before creation of the gate trench. As shown, the deep implant bridge region 301 is located at the bottom of the gate trench with the top of the deep implant bridge region above the bottom the gate trench. The sides of the deep implant bridge region 301 extend past the sidewalls of the gate trench into the drift region 102. A bottom of the deep implant is below the bottom of the gate trench.

FIG. 3B depicts across-sectional view along dotted line 111 of the SiC semiconductor device having a body implant bridge region 302 according to aspects of the present disclosure. The body implant bridge region 302 may be formed by a doping implant of the second conductivity type at the bottom of the gate trench 303. The gate trench 303 may be wider than the body implant bridge region 302 to accommodate the implantation of the bridge at the bottom of the trench. As shown, the body implant bridge 302 is located beneath the gate trench with the top of the bridge at the bottom of the gate trench. The width of the body implant bridge 302 may be less than the width of the gate trench 303 and the depth of the body implant bridge 302 may be deeper into the drift region 102 than the gate trench.

FIG. 3C shows cross-sectional view along dotted line 111 of the SiC semiconductor device having a sidewall implant bridge region 304 according to aspects of the present disclosure. The sidewall implant bridge region 304 may be formed by performing a doping implant of the second conductivity at the side and bottom of the gate trench. In some implementations, the sidewall opposite the 11$\bar{2}$0 side 109 of the gate trench is doped with the second conductivity type. The sidewall implant bridge region 304 has a top level with the top of the gate trench and sidewall implant bridge the region 304 extends the past the depth of the gate trench. The bottom on of the sidewall implant bridge 304 is below the bottom of the trench. The sidewall implant bridge is wider on one side of the gate trench and extends underneath the gate trench ending around the midpoint of the width of the gate trench.

The bridge regions may provide improved breakdown resistance for the gate during operation of the semiconductor device.

Formation

Figure 4A:
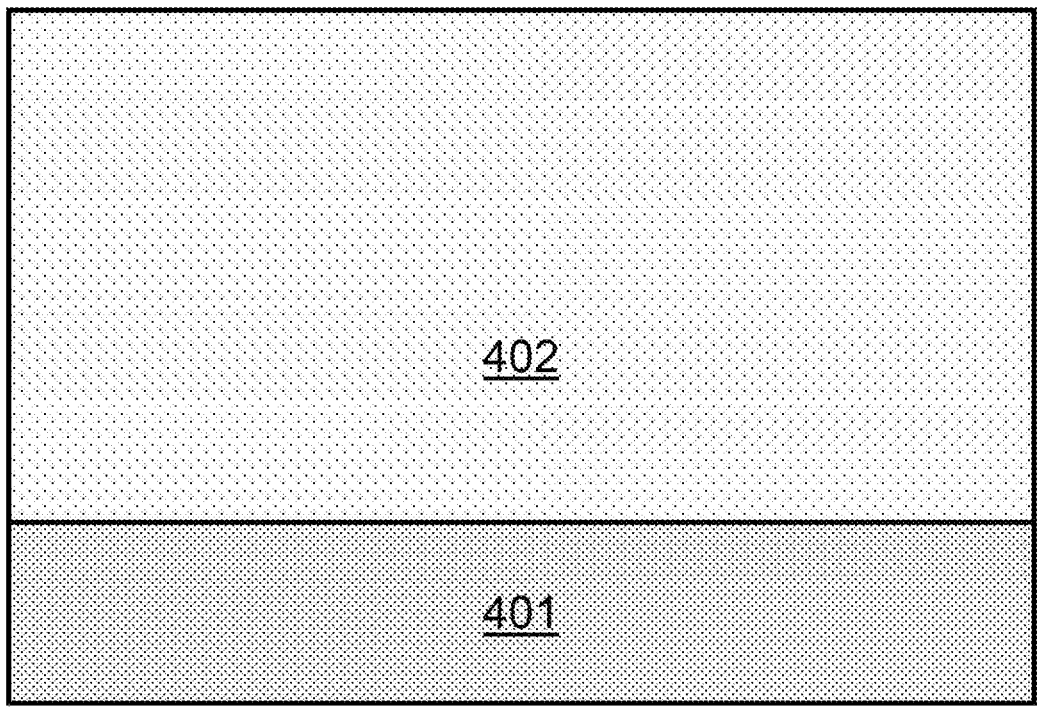
FIG. 4A is a cross-sectional diagram illustrating a portion of a method of making the SiC semiconductor device showing formation of the drift region according to aspects of the present disclosure.
Figure 4B:
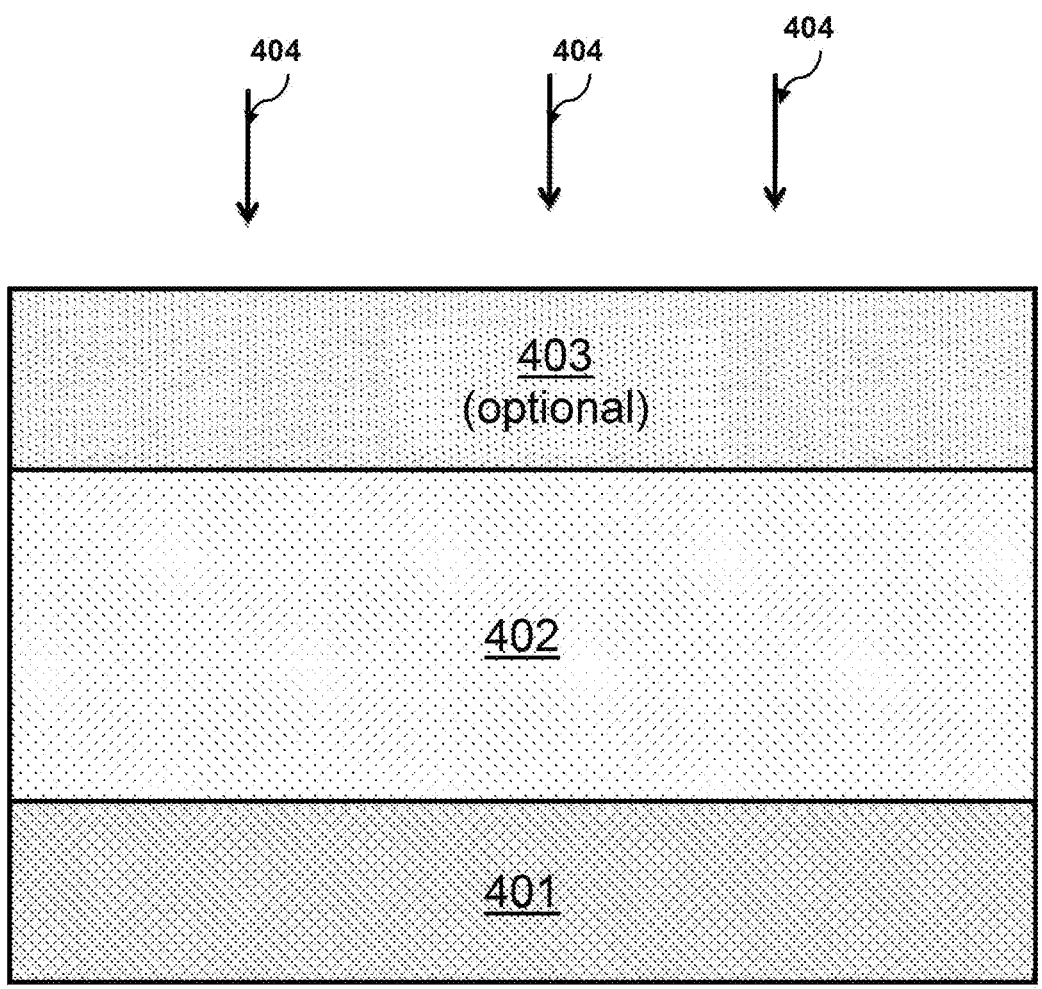
FIG. 4B is a cross-sectional diagram illustrating another portion of a method of making the SiC semiconductor device showing the optional formation of a JFET region according to aspects of the present disclosure.

FIGS. 4A-4J depicts a method of making the SiC semiconductor device according to aspects of the present disclosure. As shown in FIG. 4A a Silicon Carbide wafer substrate 401 is provided for formation of the semiconductor device. The Silicon carbide substrate 401 may be any polytype of silicon carbide, for example and without limitation the 4H-SiC polytype. The SiC substrate may be heavily doped with the first conductivity type. The doping concentration may be such that the substrate 401 has a resistivity between about 0.0015 and about 0.030 ohm-cm. A silicon carbide drift region 402 of the first conductivity may be formed over top the SiC substrate 401 through epitaxy. The doping concentration of the drift region formed through epitaxy may be for example and without limitation with N-type dopant between $1e^{15}$ and $5e^{17}/cm^3$. FIG. 4B depicts implantation of an optional JFET implant layer 403. The JFET implant layer may be more heavily doped with the first conductivity type than the drift region 402. The JFET layer 403 maybe implanted 404 on the surface of the drift region 402. The JFET layer may be implanted with the first conductivity type using ion implantation 404. The implant may for example and without limitation be of N type dopants such as Nitrogen at a concentration of between $5e^{15}$ and $1e^{18}/cm^3$ over the surface of the silicon carbide wafer at between 30 Kev and 1.5 MeV.

Figure 4C:
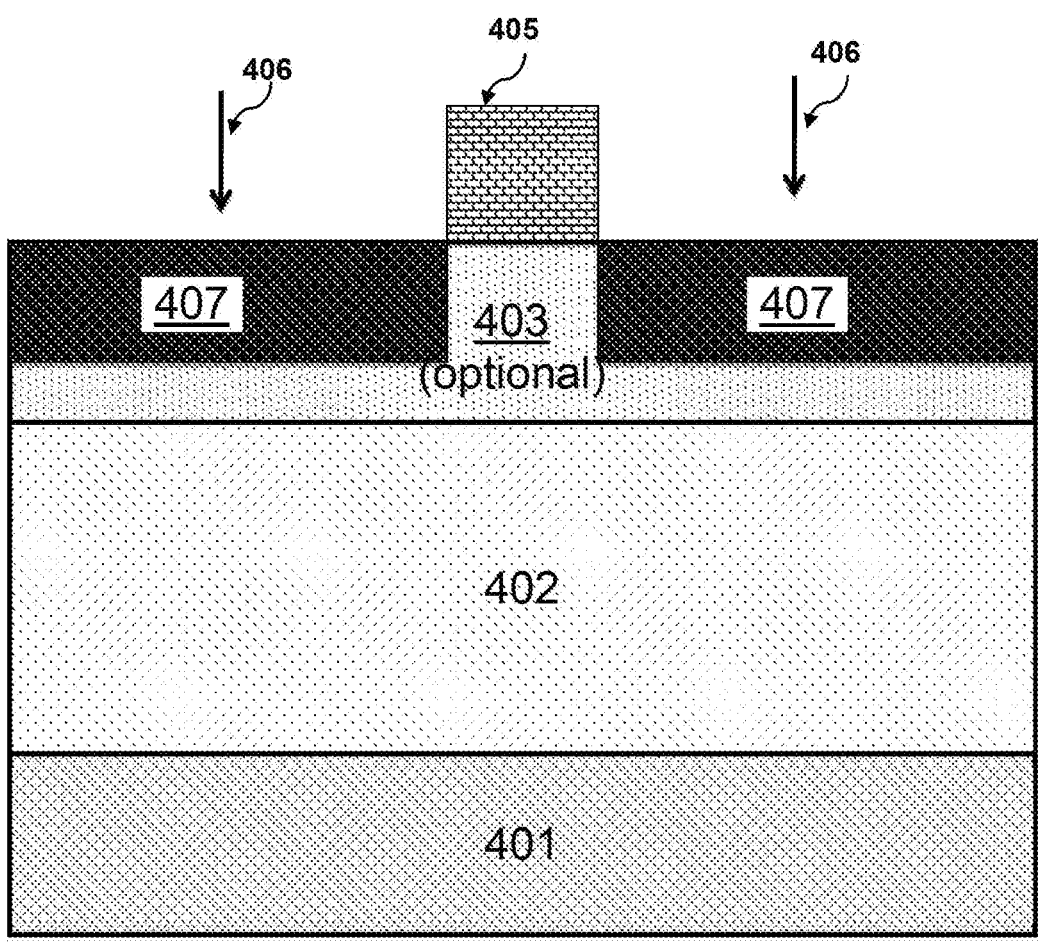
FIG. 4C is a cross-sectional diagram illustrating another portion of the method of making the SiC semiconductor device showing formation of the body regions according to aspects of the present disclosure.
Figure 4D:
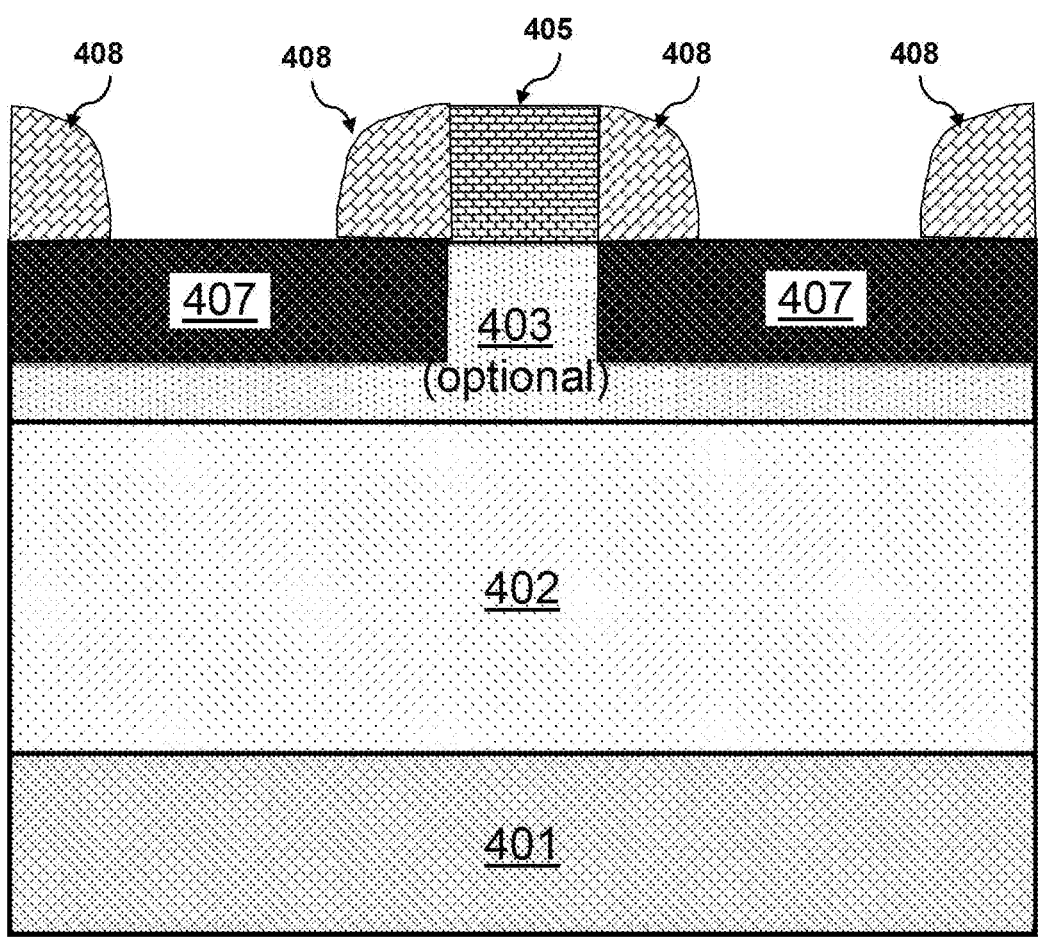
FIG. 4D is a cross-sectional diagram illustrating another portion of the method of making the SiC semiconductor device showing creation of spacers for alignment according to aspects of the present disclosure.

A first mask 405 is created on the surface of the substrate composition as shown in FIG. 4C. The first mask may have a pattern of openings configured in such a way that a separation region is created by implantation of suitable dopants through the openings. The separation region may be about 0.5 microns (μm) to about 3 μm wide. The mask may be formed from a photoresist or oxide deposited on the surface of the substrate composition of some other mask known in the art. Then body regions 407 are formed on exposed surfaces of the masked substrate composition through ion implantation 406. The substrate composition may be implanted 406 with for example and without limitation P-type dopants, such as Aluminum or Boron, at a concentration of between $1e^{16}$ and $1e^{20}/cm^3$ with an energy of implantation of between 30 KeV and 1.2 MeV. Spacers 408 may then be formed in the exposed surface of the substrate composition as shown in FIG. 4C. The spacers may be used for self-alignment of during implantation of source regions and may be formed by a blanket oxide deposition step followed by an anisotropic etching. The anisotropic etching may be for example and without limitation Inductively Coupled Plasma etching (ICP), Reactive Ion Etch (RIE) or other known anisotropic etch for oxides.

Figure 4E:
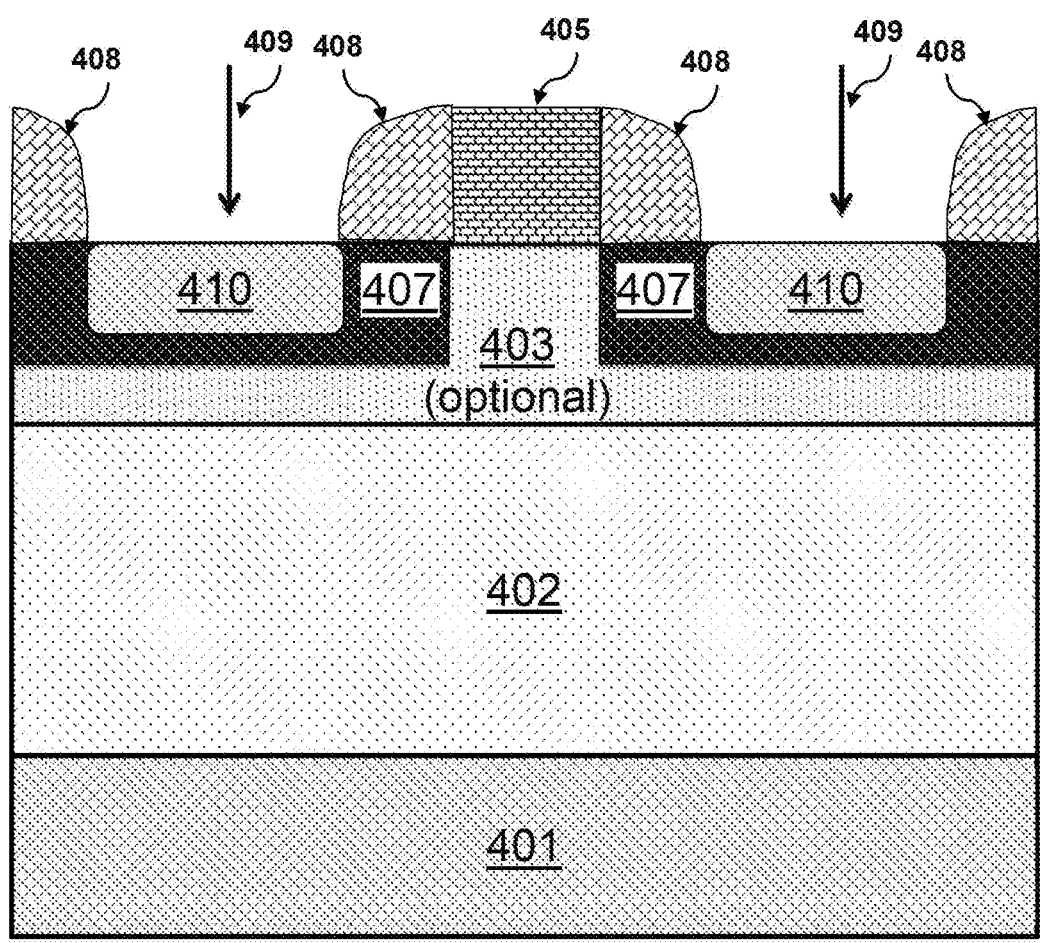
FIG. 4E is a cross-sectional diagram illustrating another portion of the method of making the SiC semiconductor device showing formation of the source regions according to aspects of the present disclosure.
Figure 4F:
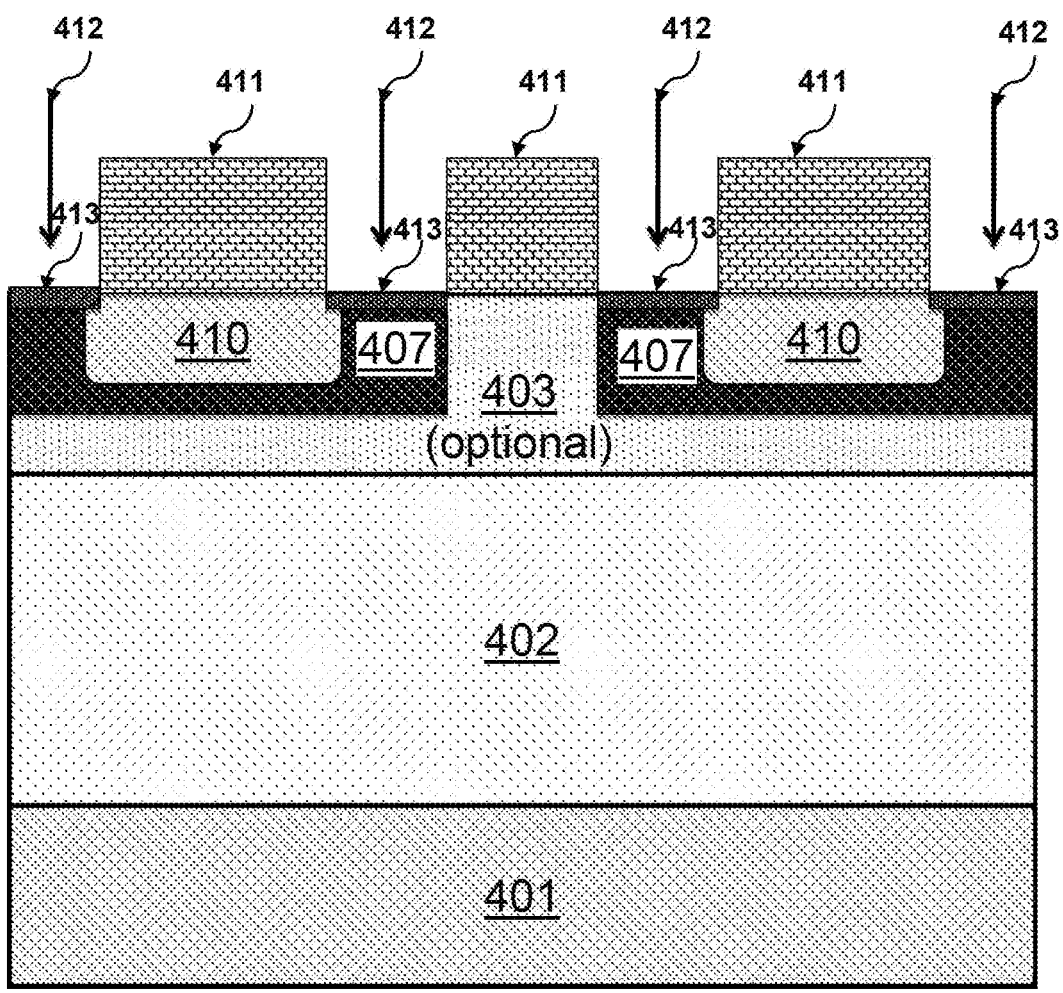
FIG. 4F is a cross-sectional diagram illustrating another portion of the method of making the SiC semiconductor device showing an optional formation of the surface body regions according to aspects of the present disclosure.

After the spacers 408 are created, a source region 410 is formed in the substrate composition as shown in FIG. 4E. The source region 410 may be created through implantation of ions 409 of the first conductivity type into the unmasked areas of the substrate composition, specifically the body regions 407. The ions 409 may be for example and without limitation N-type dopants such as Nitrogen with a concentration of between $1e^{18}$ and $2e^{20}/cm^3$ and an energy of implantation of between 10 KeV and 600 KeV. According to some aspects of the present disclosure the ion implantation process may be performed at room temperature or at for example and without limitation between 300-600° C. The first mask and spacers are then removed, e.g., by washing or other known mask removal process. FIG. 4F shows that a second mask 411 is then applied to the substrate composition to properly align implantation of the surface body region 413. The second mask may be formed by application of a photo resist or oxide deposition or other controlled masking process or combination of masking materials (e.g., oxide, nitride, polysilicon) known in the art. The surface body region 413 may be formed through implantation of ions 412 onto exposed areas of the substrate composition through the mask 411. The ion implantation may be of the second conductivity type, which for example may be P-type dopants such as Aluminum or Boron at a concentration of greater than $1e^{19}/cm^3$ at and energy of implantation of between 30 KeV and 400 KeV. As shown, the alignment of the mask 411 may be such that implantation occurs in the body region 407 and not in a source region 410. Additionally, the second mask 411 is aligned to maintain a separation between the body regions 407.

The second mask 411 is then stripped away by washing or some other appropriate mask removal process known in the art leaving a bare substrate composition. The substrate composition with implanted regions must be activated to function in Silicon Carbide. Activation or annealing requires raising the silicon carbide substrate composition to elevated temperatures. During silicon carbide semiconductor fabrication, dopant implant activation requires a suitable temperature, e.g., between 1500° C. and 1800° C.

Figure 4G:
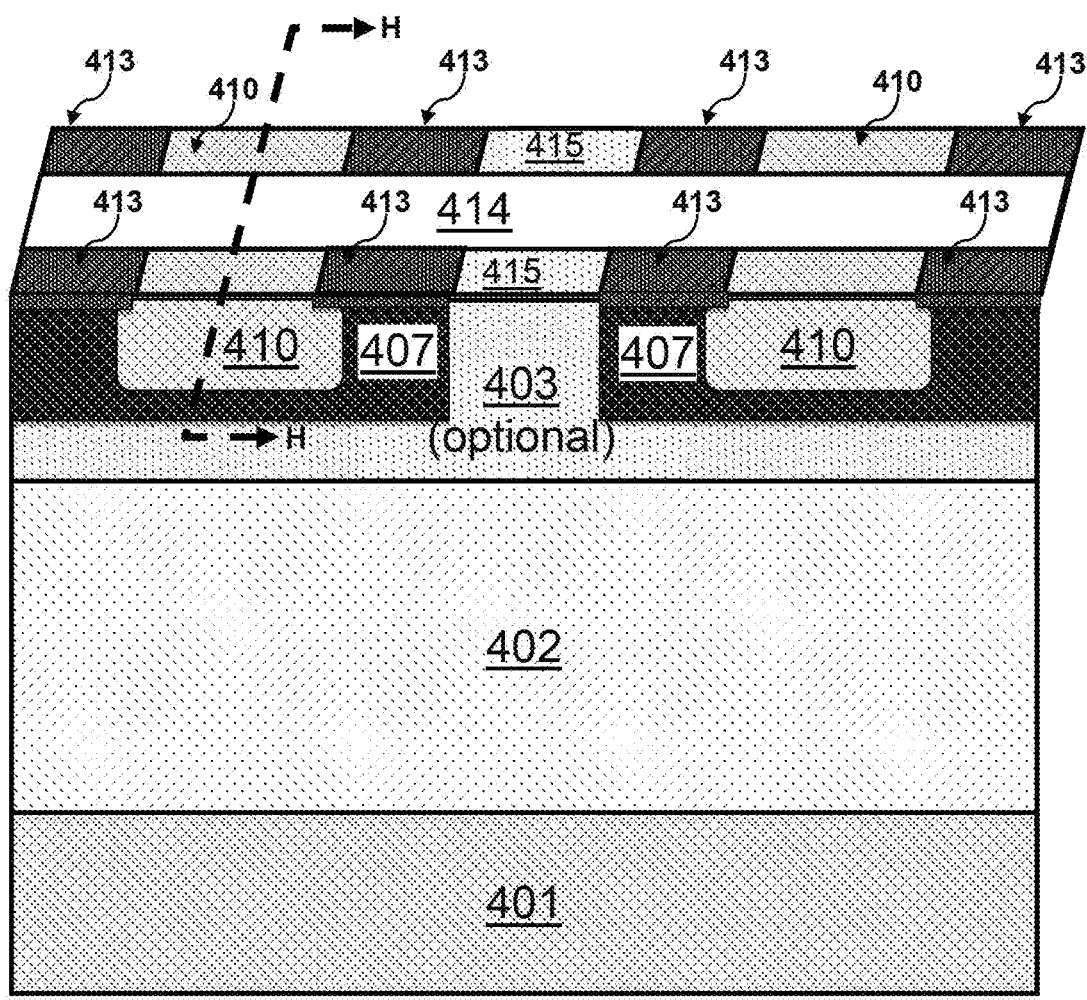
FIG. 4G is a three-quarters view partial cross-sectional diagram illustrating another portion of the method of making the SiC semiconductor device showing formation of the gate trench according to aspects of the present disclosure.
Figure 4H:
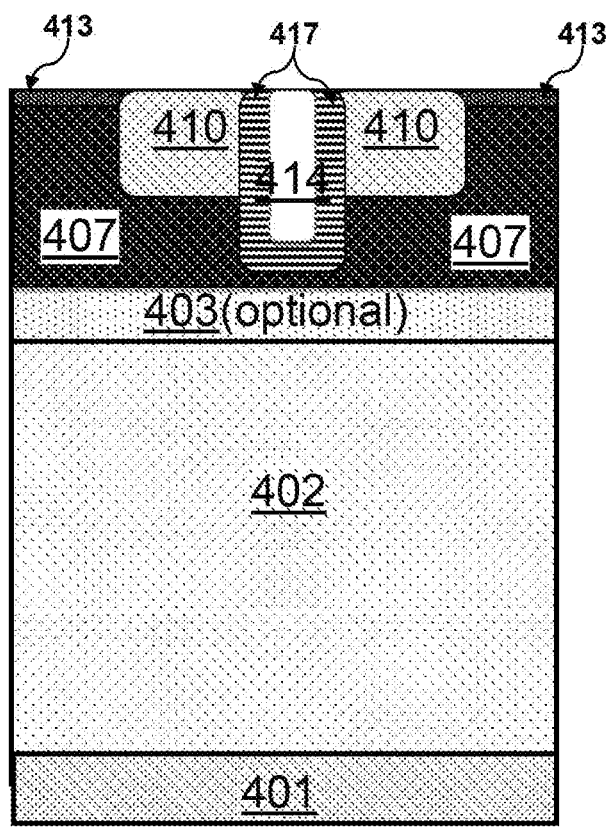
FIG. 4H is a cross-sectional diagram illustrating another portion of the method of making the SiC semiconductor device showing formation of the gate trench dielectric according to aspects of the present disclosure taken along line H-H of FIG. 4G.
Figure 4I:
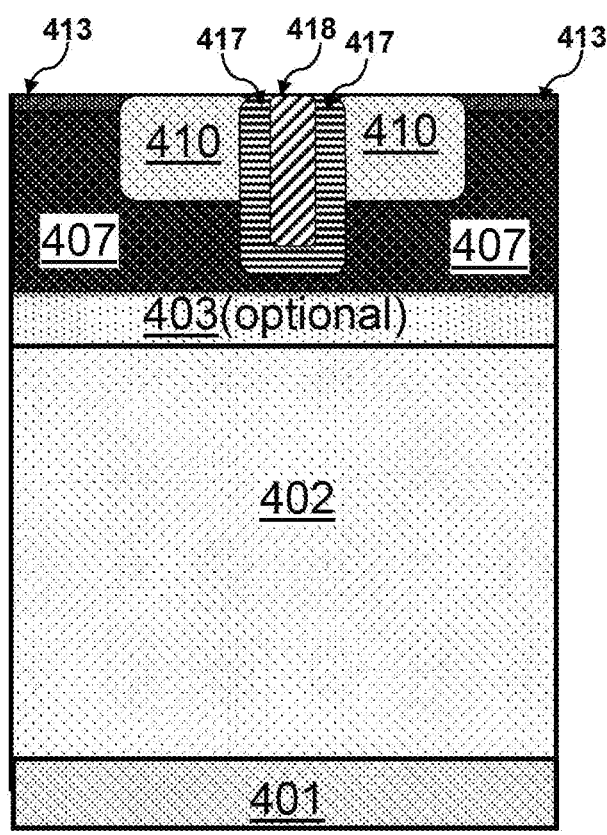
FIG. 4I is a cross-sectional diagram illustrating another portion of the method of making the SiC semiconductor device showing formation of the gate trench electrode according to aspects of the present disclosure taken along line H-H of FIG. 4G.
Figure 4J:
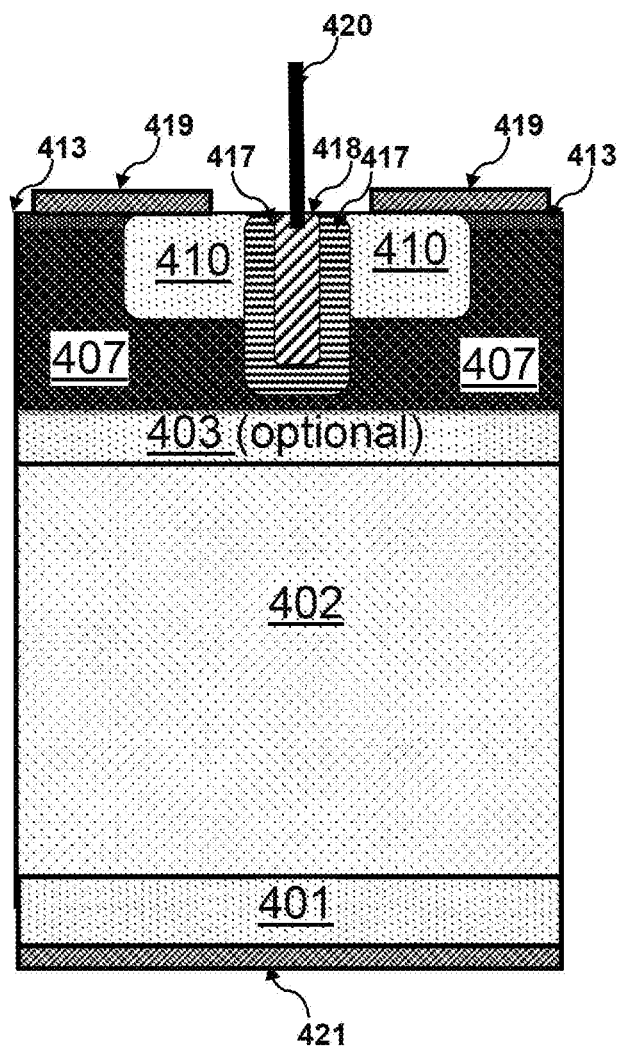
FIG. 4J is a cross-sectional diagram illustrating another portion of the method of making the SiC semiconductor device showing formation of the source, gate and drain contacts according to aspects of the present disclosure taken along line H-H of FIG. 4G.

After activation, a gate trench 414 is formed in the substrate composition as shown in FIG. 4G. The gate trench runs laterally through both of the shown body regions 407 in a direction generally parallel to a C-face of the SiC structure, source regions 410 and surface body regions 413. As discussed above, the angle and alignment of the gate trench is chosen such that the sidewall of the trench exposes a higher carrier mobility face (e.g., the $11\bar{2}0$ face) of the SiC substrate. The gate trench 414 may be formed by etching with plasma, e.g., reactive ion etching (RIE) or inductively coupled plasma (ICP) etching. Additionally, the separation region 415 between the two body regions 407 and source regions 410 is visible here. In this embodiment, the separation is region is formed by the optional JFET implant layer 403. In alternative implementations, the separation regions may be formed by the drift region 402. The dashed line H-H indicates the plane of the cross-sectional views shown in FIG. 4H and FIG. 4I. FIG. 4H shows a cross sectional view of the semiconductor device having a dielectric layer 417 formed on the inner surface of gate trench 414. The trench gate dielectric layer 417 may be for example and without limitation a silicon oxide layer grown or deposited on the surface of the gate trench. Alternatively, the gate dielectric layer 417 may be a stack of dielectric layers, such as thermal or deposited Silicon Dioxide ($SiO_2$) or other materials such as high-k dielectrics. An electrically conductive material is then formed on top of the trench gate dielectric layer 417 to fill (or partially fill) the remaining portion of the gate trench 414 to form a gate electrode 418. The electrically conductive material may be for example and without limitation polycrystalline, silicon, which may be deposited over the surface of the gate trench dielectric layer by deposition methods such as chemical vapor deposition or other deposition methods known in the art. After formation of the trench gate electrode 418 the SiC substrate composition may be planarized to remove excess silicon oxide and/or polycrystalline silicon.

After planarization a source contact 419, a gate contact 420 and a drain contact 421 are formed on surface of the substrate composition. The source contact 419, gate contact 420 and drain contact 421 may be made of any suitable metals such as and without limitation Nickel, Titanium, Aluminum or an alloy of a plurality of metals. Such metals may be deposited e.g., by chemical vapor deposition (CVD) or physical vapor deposition (PVD).

Figure 5A:
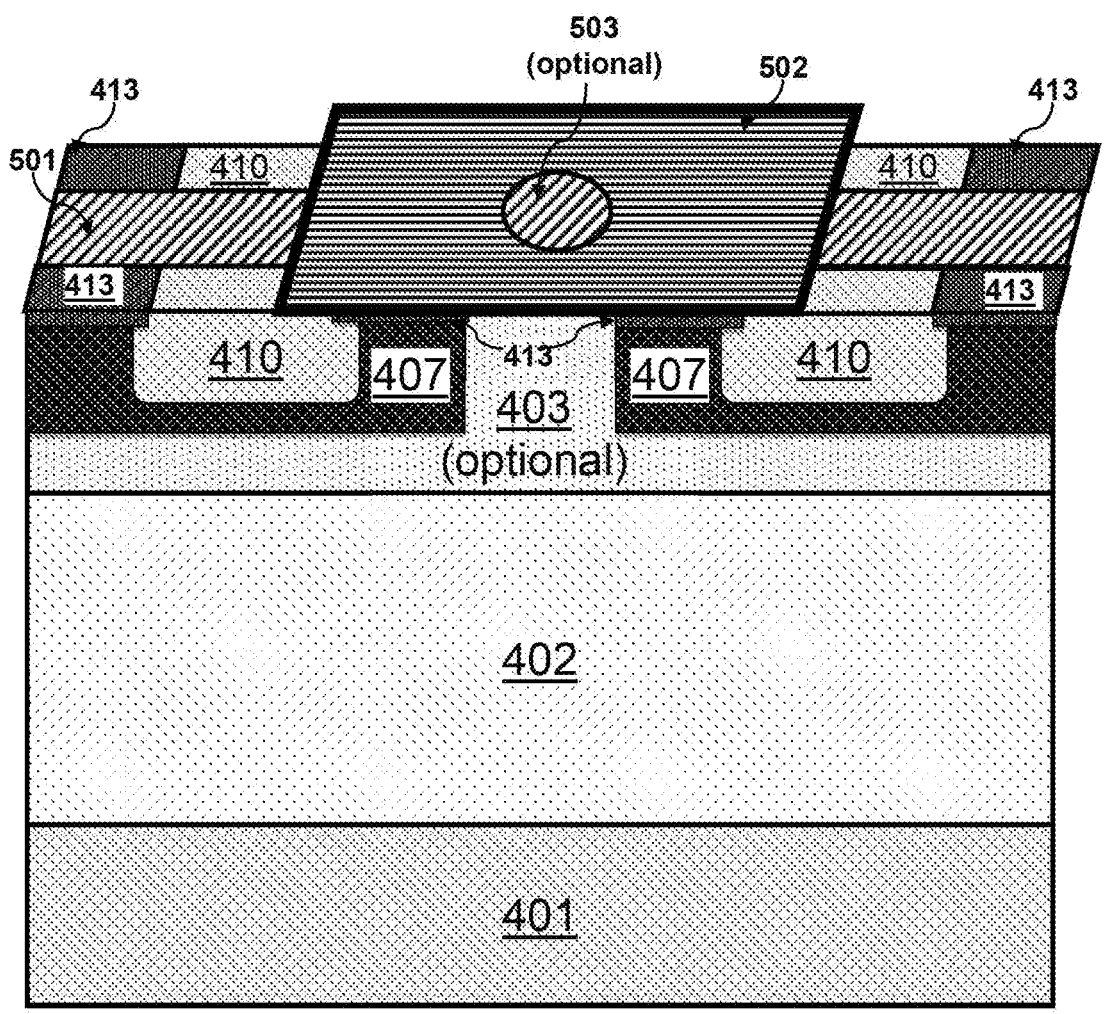
FIG. 5A is a three-quarters view partial cross-sectional diagram illustrating a portion of a method of making an alternative SiC semiconductor device having a planar gate, showing formation of the planar gate dielectric according to aspects of the present disclosure.
Figure 5B:
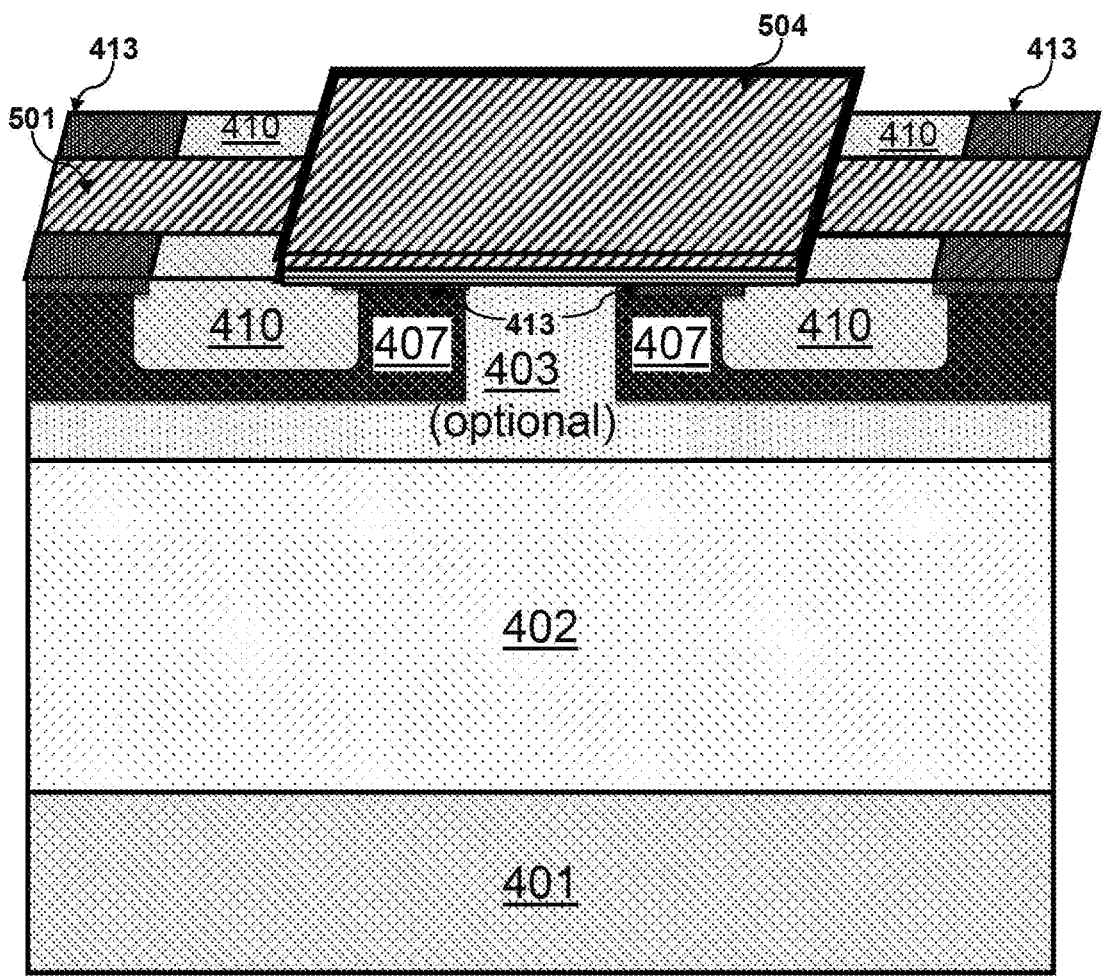
FIG. 5B is a three-quarters view partial cross-sectional diagram illustrating another portion of the method of making an alternative embodiment of the SiC semiconductor device having a planar gate, showing formation of the planar gate electrode according to aspects of the present disclosure.
Figure 5C:
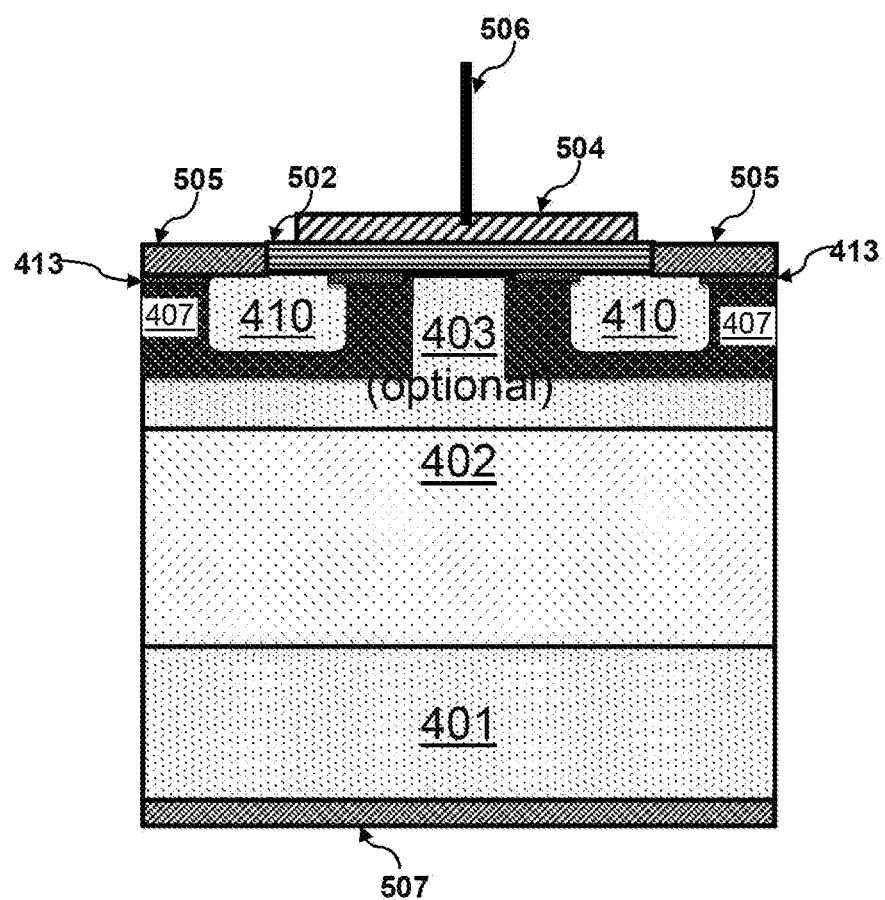
FIG. 5C is a cross-sectional diagram illustrating another portion of the method of making an alternative embodiment of the SiC semiconductor device having a planar gate, showing formation of the source, gate and drain contacts according to aspects of the present disclosure.

FIGS. 5A, 5B and 5C depict a method of making an alternative Silicon Carbide semiconductor device having a planar gate on the surface of the substrate composition orthogonal to the direction of the gate trench 501. FIG. 5A depicts the method starting after the gate trench electrode has been formed as discussed above with respect to FIG. 4I. A planar gate dielectric layer 502 may be formed over the gate trench 501 and the separation region. The planar gate dielectric layer 502 may be for example and without limitation a silicon oxide layer grown or deposited in the desired area on the surface of substrate composition. Optionally a whole 503 may be created in the planar gate dielectric layer 502 during formation to expose the electrode in the gate trench 501 so that the planar gate electrode is in conductive contact with the trench gate electrode. Alternatively, the planar gate electrode and the trench gate electrode may be in conductive contact through other means such as a wire or metal lead between the two features.

FIG. 5B shows a planar gate electrode 504 formed over the planar gate dielectric 502. The planar gate electrode may be for example polycrystalline silicon deposited on the surface of the planar gate dielectric layer 502. In some implementations, the planar gate electrode may fill the hole 503 in the planar gate dielectric 502 to make conductive contact with a trench gate electrode 501 exposed by the hole.

As shown in FIG. 5C, metal for source contacts 505 and drain contacts 507 are deposited on surfaces of the substrate composition. The source contacts 505 and drain contacts 507 may be any suitable metal such as and without limitation Nickel, Titanium, Aluminum or an alloy of a plurality of metals. A gate contact 506 may be independent of the source contact 505 and drain contact 507. The gate contact 506 material may be deposited in electrical contact with the gate electrode 504 and may be any suitable metal such as and without limitation Nickel, Titanium, Aluminum or an alloy of a plurality of metals. Such metals may be deposited e.g., by chemical vapor deposition (CVD) or physical vapor deposition (PVD). The addition of a planar gate with the trench gate provides greater carrier mobility as charge carriers may move laterally along the surface of the substrate composition as well as parallel to the trench gate sidewall.

It should be understood that while the above embodiments describe the semiconductor device with relation to two body regions and two source regions the breadth of this disclosure is not so limited. According to aspects of the present disclosure, there may be any number of body regions having any number of source regions separated by separation regions with gate trenches that run laterally through each region along a face of the SiC structure having higher carrier mobility than the C-face.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An apparatus, comprising:
    a silicon carbide substrate heavily doped with the first conductivity type;
    a lightly doped silicon carbide drift region of the first conductivity type over the silicon carbide substrate;
    a first body region in the drift region doped with second conductivity type wherein the second conductivity type is the opposite of the first conductivity type;
    a first source region in the first body region heavily doped with the first conductivity type;
    a gate trench formed in the first source region and first body region wherein at least one sidewall of the gate trench is parallel to a crystal plane of the silicon carbide structure having higher carrier mobility than a C-face of the silicon carbide structure and wherein the gate trench extends a length of the first body region and the source region to a separation region laterally adjacent to the first body region wherein the separation region is in the drift region; and
    a second body region in the drift region heavily doped with the second conductivity type and a second source region heavily doped with the first conductivity in the second body region wherein the first and second body region are separated by the separation region and wherein the gate trench extends across the separation region through the second body region and the second source region.

2. The apparatus of claim 1, wherein a doping concentration of the first body region increases with depth so that a maximum dopant concentration occurs at a maximum depth of the body region.

3. The apparatus of claim 1, wherein doping concentrations of the first and second body regions increases with depth so that the maximum concentration occurs at maximum depths of the first and second body regions.

4. The apparatus of claim 1 wherein a depth of the gate trench is deeper than the first source region and extends into the first body region and above the drift region.

5. The apparatus of claim 1 further comprising a surface body region heavily doped with the second conductivity type on top of the body region.

6. The apparatus of claim 1 wherein the first body region includes portions on both sides of the gate trench and the portion of first body region opposite the crystal plane of the silicon carbide structure does not have a source region.

7. The apparatus of claim 6 wherein the portion of the first body region on the side of the gate trench opposite the crystal plane of the silicon carbide structure extends the length of the gate trench with no separation region laterally adjacent to the first body region in the drift region.

8. The apparatus of claim 1 further comprising a bridge region heavily doped with the second conductivity type underneath the gate trench in the separation region.

9. The apparatus of claim 8 wherein the bridge region is a deep implant that is wider than the gate trench and wherein the top of the bridge region is above the bottom of the gate trench.

10. The apparatus of claim 8 wherein the bridge region is a body implant and is narrower than the width of the gate trench.

11. The apparatus of claim 8 wherein the bridge region extends the depth of the gate trench and the width of a bottom of the gate trench leaving one side of the gate trench exposed to the separation region.

12. The apparatus of claim 1 wherein the separation region is more heavily doped with the first conductivity type than the lightly doped drift region.

13. The apparatus of claim 1 further comprising a trench gate dielectric layer lining the inner surface of the gate trench and a trench gate electrode layer on top of the trench gate dielectric layer.

14. The apparatus of claim 13 further comprising a planar gate dielectric layer on top of the separation region and first body region and a planar gate electrode layer on top of the planar gate dielectric layer wherein the planar gate electrode layer is in electrically conductive contact with the trench gate electrode layer.

15. The apparatus of claim 1, wherein the crystal plane of the silicon carbide structure having higher carrier mobility than a C-face of the silicon carbide structure is a $11\bar{2}0$ face of the silicon carbide structure.

16. A method for making a silicon carbide trench semiconductor device, comprising:
    a) forming a lightly doped silicon carbide drift region of a first conductivity type over a silicon carbide substrate;
    b) forming a first body region in the drift region doped with a second conductivity type wherein the second conductivity type is the opposite of the first conductivity type;
    c) forming a first source region in the first body region heavily doped with the first conductivity type;

d) forming a gate trench in the first source region and first body region wherein at least one sidewall of the gate trench is parallel to a 11$\overline{2}$0 face of the silicon carbide structure and wherein the gate trench extends a length of the first body region and the source region to a separation region laterally adjacent to the first body region wherein the separation region formed in the drift region; and forming a second body region in the drift region heavily doped with the second conductivity type and a second source region heavily doped with the first conductivity in the second body region wherein the first and second body region are separated by the separation region and wherein the gate trench extends across the separation region through the second body region and the second source region.

17. The method of claim 16, wherein the first body region includes portions on both sides of the gate trench and a source region is not formed in the portion of first body region opposite the crystal plane of the silicon carbide structure.

18. The method of claim 17, wherein a portion of the first body region on a side of the gate trench opposite the 11$\overline{2}$0 face is formed to extend the length of the gate trench with no separation region laterally adjacent to the first body region in the drift region.

19. The method of claim 16 further comprising forming a planar gate dielectric layer on top of the separation region and first body region and forming a planar gate electrode layer on top of the planar gate dielectric layer wherein the planar gate electrode layer is in electrically conductive contact with a trench gate electrode layer disposed inside the gate trench.

* * * * *